United States Patent [19]

Packard

[11] 4,322,641
[45] Mar. 30, 1982

[54] NOISE REDUCTION SYSTEM
[75] Inventor: Thomas N. Packard, Syracuse, N.Y.
[73] Assignee: Packburn Electronics, Syracuse, N.Y.
[21] Appl. No.: 102,409
[22] Filed: Dec. 11, 1979
[51] Int. Cl.³ .............................................. H03H 7/12
[52] U.S. Cl. .................................. 307/521; 330/107; 307/543
[58] Field of Search ................... 328/167; 307/233 R, 307/543; 330/107

[56] References Cited
U.S. PATENT DOCUMENTS

| | | | |
|---|---|---|---|
| 3,753,159 | 8/1973 | Burwen | 328/167 X |
| 4,045,731 | 8/1977 | Tokunou et al. | 328/167 X |
| 4,068,139 | 1/1978 | Bray | 328/167 X |
| 4,207,543 | 6/1980 | Izakson et al. | 328/167 X |

Primary Examiner—John S. Heyman
Attorney, Agent, or Firm—Squire, Sanders & Dempsey

[57] ABSTRACT

A process and apparatus (a) for reducing the perceived noise without perceptible loss of fidelity upon aural reproduction, of an audio input signal in electrical form by means of an electronic circuit wherein the upper limit of the bandwidth of the signal is automatically and continuously adjusted in accordance with the relationship of (i) the peak amplitude of the rate of change of the signal with respect to time to (ii) the instantaneous amplitude within a selected frequency band of the signal, and (b) a system for detecting and discriminating between noise and audio transients in the input signal and retaining the audio transients in the output signal.

15 Claims, 7 Drawing Figures

NOISE REDUCTION SYSTEM

BACKGROUND OF THE INVENTION

The present invention relates to the electronic processing for aural reproduction of audio signals in electrical form.

In reproducing an audio recording, not only is the audio source reproduced, but also reproduced are undesirable extraneous noise components caused by imperfections in the original recording process, the storage medium, and in the reproduction process. Such noises commonly are designated by such terms as "surface noise", "crackle", "ticks", etc. These noises are generally composed of: (i) a component sometimes known as continuous or "white" noise which is of an amplitude generally not exceeding the desired signal amplitude and is distributed fairly uniformly throughout the audio frequency range; and (ii) a component which consists of transient noises generally of short duration and amplitudes at least comparable to that of the desired audio signal. (As used herein, the term "input signal" refers to the electrical signal, consisting of generally continuous and transient signals, bearing the audio information intended to be heard by the listener or receiver; the term "noise" refers to the noise, both continuous and transient, which may be imposed on the input signal; the term "total input signal" refers to the total electrical signal being transmitted, i.e., input signal plus noise; and the terms "audio transient" and "noise transient" refer, respectively, to those portions of the input signal and noise in transient form.)

The applicant is a joint inventor of systems for reducing transient noise in audio signals which are the subjects of U.S. Pat. Nos. 4,151,471 and 4,155,041, and of co-pending U.S. patent application Ser. No. 957,713 filed Nov. 6, 1978. The foregoing systems are concerned with suppressing noise in a total input signal that is caused by discrete noise transients. The present invention is principally concerned with the suppression of perceived continuous noise, although transient noise is also reduced by this invention.

In the processing of an electrical audio signal for aural reproduction by means of an audio amplifier, the concept of automatically varying the width of the frequency passband of the amplifier to reduce noise has long been known. The variation of the passband in relation to the amplitude of the total input signal in order to reduce the audibility of continuous noise with a minimum effect on the perceived fidelity of the input signal goes back at least as far as Harmon H. Scott's U.S. Pat. Nos. 2,606,969, 2,606,970, 2,606,971 and 2,606,973. Those patents provide an excellent account of the psychoacoustical basis of this principle. Fundamentally, the variation in signal bandwidth takes advantage of the variation in sensitivity of the human ear over the audio frequency range with the loudness of the sound received. Louder sounds tend to mask noise and permit use of a wider frequency range than do quieter sounds for the same listener-perceived tonal quality. Scott's "dynamic noise suppressor" operates in a rather gradual manner in varying the passband of the amplifier, especially after loud passages, lest a too evident change in noise become audible. The dynamic noise suppressor is incapable of supressing transient noises selectively. High amplitude noise transients can cause an increase in signal bandwidth that is audible after the passage of the transient. Low amplitude noise transients are only generally suppressed by the dynamic noise suppressor depending upon each transient's exact characteristics. Various other embodiments of this principle have been disclosed in U.S. Pat. Nos. 2,638,501 (Coleman) and 3,678,416 (Burwen).

Dynamic noise suppressors that operate by varying the extremes of the signal bandwidth are not effective in reducing noises that occur at or about the middle of the audio frequency range. To reduce noise in middle of the bandwidth, some disclosures, notably U.S. Pat. Nos. 3,403,224 (Schroeder), 3,803,357 (Sacks) and 3,989,897 (Carver), divide the audio frequency range, or a significant portion of it, into a plurality of contiguous frequency bands of, typically, an octave in width. Various methods are disclosed in the cited patents for determining, over a given period of time, the relation of signal to noise in each of the frequency bands and disabling those bands from transmission found to contain chiefly noise components. The signal is reconstituted by the combining of the frequency bands not disabled.

Compressor-expander systems reduce noise in audio signals by compressing the dynamic range of the signal in the recording process, and by expanding it in the playback process to the extent that it had been compressed. Such systems are disclosed in U.S. Pat. Nos. 3,665,345 (Dolby), 3,729,693 (Dolby), 3,732,371 (Burwen), 3,813,559 (DeBoer), 3,815,039 (Fujisawa), 3,828,280 (Dolby), 3,829,715 (VanSluys) and 3,846,719 (Dolby). These systems are effective in reducing noise without audible effect on the perceived fidelity of reproduction only in those sound recordings which are specifically pre-encoded for such systems.

SUMMARY OF THE INVENTION

It is a general object of the present invention to reduce perceived noise in an electrical signal including desired audio information and noise without loss, upon aural reproduction, of the fidelity of the audio information.

A further object is to provide means for economically and effectively reducing noise perceived in electrical audio signals, upon aural reproduction, without loss of fidelity.

Yet another object is to provide improved apparatus for reducing perceived noise, upon aural reproduction, in electrical signals emanating from such sources as phonograph recordings, radio transmissions, optical film recordings, magnetic audio tapes and other signal sources, without apparent loss of fidelity.

Other objects will be apparent from the description to follow and from the appended claims.

The foregoing objects are achieved according to the preferred embodiment of the invention by varying the upper limit of the bandwidth of the total input signal. Apparatus according to the preferred embodiment of the invention includes an active filtering means by which the desired variation in bandwidth may be achieved. The frequency response characteristics of the active filtering means are adjusted according to a comparison of the peak amplitude of the rate of change with respect to time of the total input signal to the instantaneous amplitude, within a selected frequency band, of the total input signal. The comparison provides a reliable estimate of the relative continuous noise and frequency content of the total input signal so that the bandwidth of the active filtering means may be adjusted to reduce the perceived noise in the input signal. Additional apparatus according to the preferred embodiment of the invention includes a means for detecting transients and distinguishing noise transients from audio transients. The distinguishing means adjusts the active filtering means so as to retain the audio transients in the input signal. The objects of the invention are accomplished economically without the use of a plurality of filters and without any need for encoding or decoding the input signal.

DESCRIPTION OF THE PREFERRED EMBODIMENT

The present invention provides a process and apparatus for reducing the perceived noise on aural reproduction of a total input signal in electrical form. The process and apparatus passes the total input signal through a dynamic low-pass filter, so that the frequency components of the signal in the vicinity of and above the filter cut-off frequency are attenuated while the lower frequency components of the total input signal pass unaffected. The filter cut-off frequency is automatically adjusted according to the relationship of the peak amplitude of the rate of change with respect to time of the total input signal to the amplitude of the total input signal within a selected frequency band. The comparison provides a reliable estimate of the relative noise and frequency content of the total input signal so that the cut-off frequency of the filter may be adjusted to attenuate the noise component of the total input signal without apparent loss of signal fidelity. The apparatus according to the invention comprises electronic circuitry for forming the filter, monitoring the total input signal and adjusting the cut-off frequency of the filter.

The preferred embodiment of the present invention additionally provides a process and apparatus for detecting transients in the total input signal and distinguishing audio transients from noise transients. The additional process and apparatus causes the cut-off frequency to increase rapidly on the detection of an audio transient, but to leave the cut-off frequency unaffected on the detection of a noise transient. The additional apparatus according to the invention comprises electronic circuitry for detecting transients in the total input signal and adjusting the cut-off frequency of the filter upon the detection of an audio transient.

Figure 1:
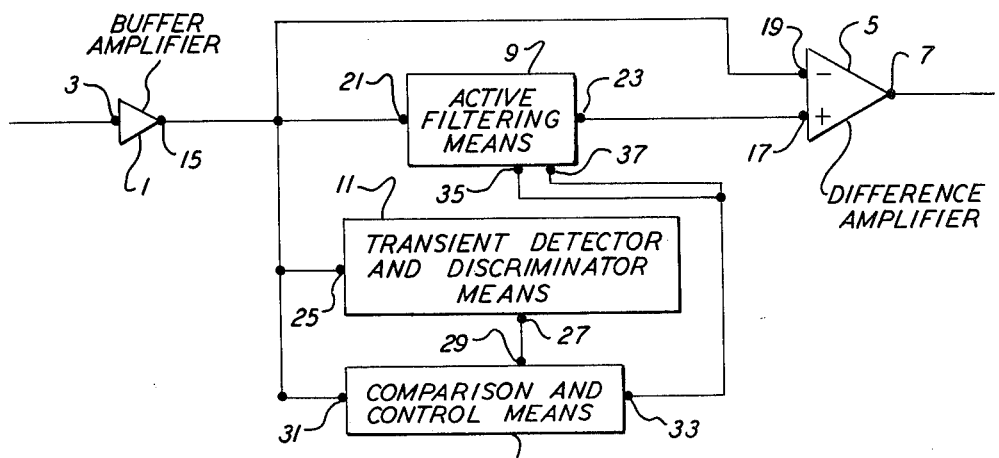
FIG. 1 is a schematic drawing of the preferred embodiment of the invention.

Referring now to FIG. 1, a system in the form of a block diagram is shown which includes a buffer amplifier 1 having an input terminal 3, a difference amplifier 5 having an output terminal 7, an active filtering means 9, a transient detector and discriminator means 11, and a comparison and control means 13. The output terminal 15 of amplifier 1 is directly connected to the negative sense input terminal 19 of amplifier 5. An input terminal 21 of active filtering means 9 is connected to output terminal 15 of amplifier 1, and the output terminal 23 of means 9 is connected to positive sense terminal 17 of amplifier 5. The input terminal 25 of transient detector and discriminator means 11 is connected to output terminal 15 of amplifier 1 and the output terminal 27 of means 11 is connected to an input terminal 29 of comparison and conrol means 13. Another input terminal 31 of means 13 is connected to output terminal 15 of buffer amplifier 1, and the output terminal 33 of means 13 is connected to input terminals 35 and 37 of active filtering means 9.

Figure 2:
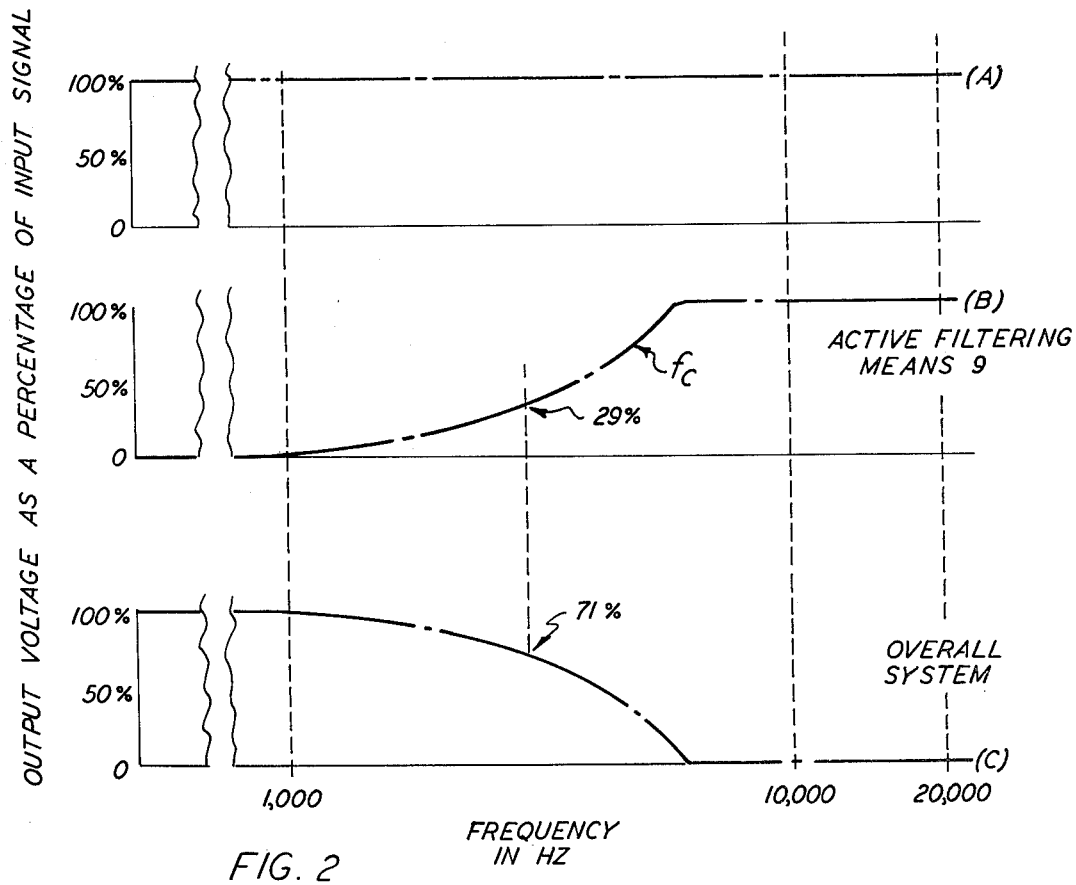
FIG. 2 is a graphical illustration of the effect of the invention according to the preferred embodiment upon a total input signal.

Total input signals enter the system of FIG. 1 at terminal 3. The total input signal is amplified in buffer amplifier 1, and transmitted from output terminal 15 to input terminal 19 of difference amplifier 5 unmodified in its frequency characteristics. Referring to FIG. 2, the effect on the signal passing along the path between output terminal 15 and input terminal 19 of the two amplifiers 1 and 5 is illustrated in part A thereof, wherein it is shown that the amplitude of the signal at each frequency is unmodified. Active filtering means 9 acts as a high-pass filter in the manner illustrated in part B of FIG. 2, decreasing attenuation of its input signal in the vicinity of the cut-off frequency and beyond with increasing frequency. The cut-off frequency, $f_c$, of the active filtering means 9 is defined to be the frequency at which the total input signal voltage is reduced at the filter output to 0.707 times its input value. The signal appearing at output terminal 7 of difference amplifier 5 consists of the arithmetic difference between the signals applied to input terminals 19 and 17. The frequency response of active filtering means 9 is such that at frequencies at least twice as great as its cut-off frequency, the signal applied to terminal 17 is identical in magnitude and phase to the signal applied at terminal 19. For all such frequencies, the signal at terminal 7 will be zero and the overall system will act as a low-pass filter having the frequency response characteristic illustrated in part C of FIG. 2. That response is obtained by subtracting the response characteristic shown in part B of FIG. 2 from the unmodified total input signal shown in part A.

This indirect means of realizing a variable cut-off frequency low-pass filter permits the use of field-effect transistors in the active filtering means 9. Field-effect transistors have the most suitable characteristics of the devices currently available for the control elements in the filtering circuit, but are limited in distortion-free signal handling capacity. In the preferred embodiment, the field-effect transistors are required only to process that portion of the audio spectrum that is actually subject to modification by the system. As will be explained, the operation of comparison and control means 13 is such that when the total input signal has its maximum of high frequency energy, the cut-off frequency of active filtering means 9 reaches its maximum, and little or no signal is processed by it. By contrast, when the total input signal contains only a small amount of high frequency energy, the cut-off frequency of active filtering means 9 decreases to its lowest value, and essentially all of the limited total input signal is processed by active filtering means 9. Thus, this indirect means of realizing the active low-pass filtering means enables the use of field-effect transistors as the controlling elements with a minimum of distortion. Other persons skilled in the art may devise direct means for realizing the filtering means by employing other circuit element devices.

Figure 3:
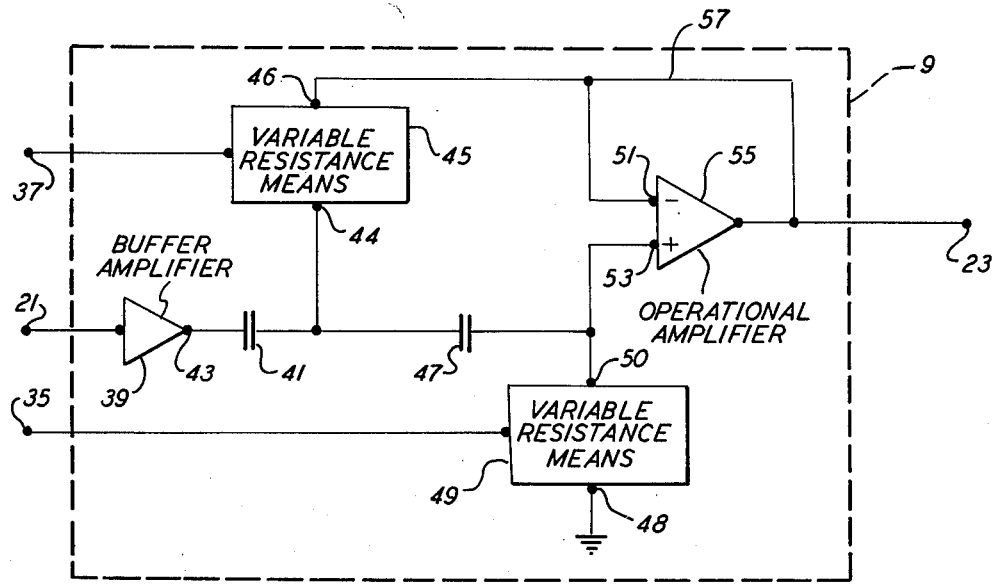
FIG. 3 is a schematic diagram of an active filtering means which may be used as part of the embodiment of FIG. 1.

FIG. 3 is a schematic representation of a preferred circuit corresponding to active filtering means 9. The active filtering means circuit includes a buffer amplifier 39 whose input terminal 21 corresponds to the input terminal 21 of means 9 in FIG. 1. A capacitor 41 is connected to the output terminal 43 of amplifier 39, to a terminal 44 of a variable resistance means 45 and to a second capacitor 47. Means 45 is under the control of comparison and conrol means 13 by virtue of the connection of output terminal 33 of means 13 as shown in FIG. 1 to input terminal 37 of means 45. Terminal 46 of means 45 is connected to negative sense terminal 51 of an operational amplifier 55. Capacitor 47 is connected to a terminal 50 of a variable resistance means 49 and positive sense terminal 53 of operational amplifier 55. Terminal 48 of means 49 is grounded. Means 49 is under the control of comparison and control means 13 by virtue of the connection of output terminal 33 of means 13 as shown in FIG. 1 to input terminal 35 of means 49. Variable resistance means 45 and 49 are preferably of the same construction, and capacitors 41 and 47 are preferably of equal value. Amplifier 55 has an output terminal corresponding to terminal 23 in FIG. 1. A feedback line 57 is connected from output terminal 23 of amplifier 55 to input terminal 51.

The foregoing circuit is an active high-pass filter which attenuates frequency components of the total input signal in the vicinity of and below its cut-off frequency. The circuit components are selected to provide for a rate of attenuation below the cut-off frequency of preferably at least 10 decibels per octave for most applications of the system. The cut-off frequency, $f_c$, of the filter is calculated as $f_c \times 1/(2\pi C\sqrt{R_a R_b})$, where $f_c$ is the cut-off frequency in hertz, C is the capacitance in farads, of either capacitor 41 or 47, $R_a$ is the resistance in ohms, of variable resistance means 45 and $R_b$ is the resistance in ohms, of variable resistance means 49.

The amplified total input signal from amplifier 1 is applied to terminal 21 of amplifier 39, where it is amplified and transmitted to the filter network comprising capacitors 41, 47, variable resistance means 45, 47 and operational amplifier 55. The circuit attenuates frequency components of the signal in the vicinity of and below its cut-off frequency as noted above.

Figure 4:
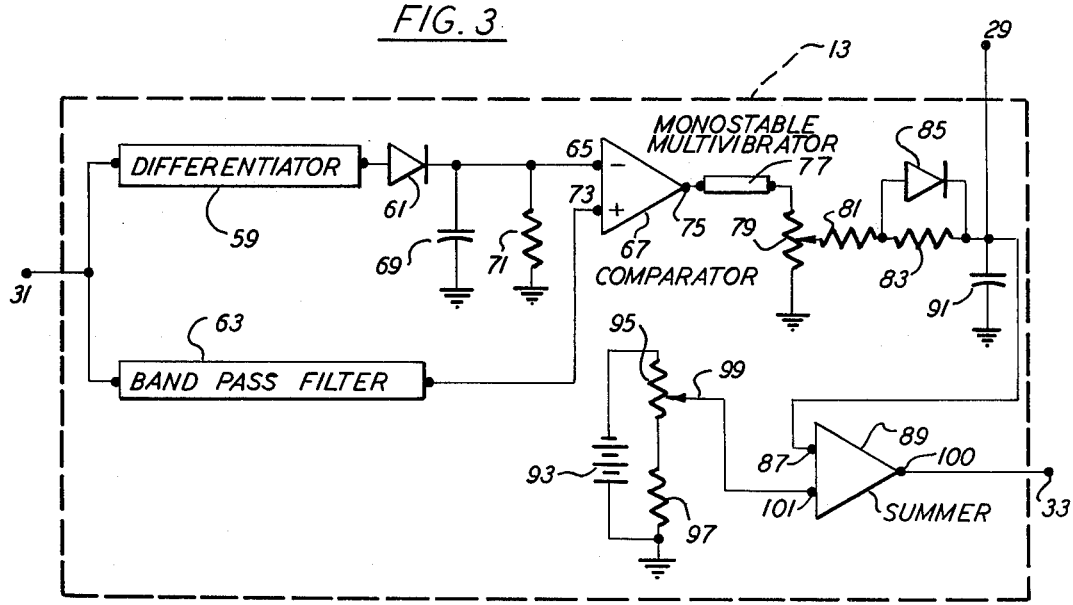
FIG. 4 is a schematic diagram of an electronic circuit for a comparison and control means which may be used as part of the embodiment of FIG. 1.

Turning to FIG. 4, a schematic drawing of a circuit for performing the function of comparison and control 13 is shown. The circuit has input terminals corresponding to terminals 29 and 31 of means 13, and an output terminal corresponding to terminal 33 of means 13. A differentiator 59 is connected from terminal 31 in a series with a rectifier or diode 61 and to the negative sense input terminal 65 of a comparator 67. Grounded, parallel-connected capacitor 69 and resistor 71 are connected to the juncture of diode 61 and terminal 65. A bandpass filter 63 is connected from input terminal 31 to the positive sense input terminal 73 of comparator 67. The output terminal 75 of comparator 67 is connected to the input terminal of a monostable multivibrator 77, the output terminal of which is in turn connected to a grounded variable resistor or potentiometer 79. The resistance of element 79 is varied by a movable element connected to a second resistor 81. Resistor 81 is in series with the parallel combination of a third resistor 83 and a rectifier or a diode 85, which combination is connected to the juncture of the input terminal corresponding to terminal 29 of means 13, an input terminal 87 of a summer 89, and a grounded capacitor 91. A sub-circuit including voltage source 93, variable resistor 95, and grounded resistor 97, is connected via a moveable element 99 for variable resistor 95 to the other input terminal 101 of summer 89. The output terminal of summer 89 corresponds to output terminal 33 of means 13 as mentioned above.

The control and comparison means circuit functions by comparing a peak signal derived from the time rate of change of the total input signal with the instantaneous amplitude of the total input signal within a selected frequency band and producing, as a result of the comparison, a control voltage which adjusts the cut-off frequency of active filtering means 9. The output of differentiator 59 is a voltage proportional to the rate of change with respect to time of the amplitude of the total input signal. The time rate of change voltage is half wave rectified by rectifier 61, the rectified voltage rapidly charging capacitor 69 to the peak amplitude of that voltage. Resistor 71 permits gradual discharge of capacitor 69 so that the charge on capacitor 69 approximately follows the variation in the peak amplitude of the time rate of change voltage. By experiment, I have determined that the positive peak value of the time rate of change of the total input signal, the signal applied to negative sense terminal 65 of comparator 67, is a useful index of the noise content of the total input signal when the input signal is at a relatively low level. In that circumstance it is desirable to reduce the cut-off frequency of active filtering means 9 so as to eliminate perceived noise from the total input signal.

The total input signal is also supplied to bandpass filter 63 and the filtered output applied to terminal 73 of comparator 67. By experiment I have determined that the amplitude of the total input signal in the frequency range from 1.7 kHz to 3.4 kHz is a useful index of the high frequency content of the input signal in the audible frequency range. In the presence of high frequency content it is desirable to raise the cut-off frequency of the system to preserve the fidelity of the input signal. Therefore, I prefer that the passband of filter 63 be the octave from 1.7 kHz to 3.4 kHz and that the filter have an attenuation of at least 12 decibels per octave outside that frequency passband.

By applying the positive peak amplitude of the time rate of change of the total input signal to negative sense input terminal 65 of comparator 67 and applying the instantaneous amplitude of the total input signal in the frequency band from 1.7 kHz to 3.4 kHz to positive sense input terminal 73 of comparator 67, the values can be continuously compared so that a determination can be made to increase or decrease the then existing cut-off frequency of active filtering means 9 through the intermediacy of the remaining circuit elements of FIG. 4.

Comparator 67 produces a negative voltage when the amplitude of the signal at input 65 exceeds that at input 73 and a positive voltage when the amplitude of the signal at input 73 exceeds that at input 65. The output signal of comparator 67 is applied to the input terminal of monostable multivibrator 77. Multivibrator 77 produces a positive voltage pulse whenever the output voltage of comparator 67 changes from a negative value to a positive value. Since the signal at terminal 73 of comparator 67 follows the instantaneous value of the total input signal in the selected frequency band (e.g., 1.7 kHz to 3.4 kHz in this embodiment), in the case of a symmetrical waveform, the voltage at terminal 73 will be negative half of the time. Only when the instantaneous value of the positive half of the wave cycle exceeds the voltage at terminal 65 of differential amplifier 67 can the output voltage of differential amplifier 67 makes a transition to a positive value. Therefore, such transitions can occur only once in each cycle of a symmetrical waveform applied to terminal 73. To accomodate this transition rate, the pulse length of multivibrator 77 preferably should be shorter than one-half the period of the upper cut-off frequency of the bandpass filter. In the embodiment I prefer, the upper cut-off frequency of the filter passband is 3.4 kHz, so that the pulse duration of multivibrator 77 preferably should not exceed 1/6800 seconds or about 147 microseconds.

The pulses produced by multivibrator 77 are applied to variable resistor 79. Diode 85 permits positive pulses from multivibrator 77 to charge capacitor 91. Provided the resistance of resistor 81 is much larger in value than the total resistance of variable resistor 79, the charging time constant of capacitor 91 will be controlled by the resistance of resistor 81. As explained hereinafter, the voltage to which capacitor 91 is charged is determined by the setting of variable resistor 79 and the charging and discharging time constants. This voltage governs the maximum cut-off frequency of active filtering means 9. Capacitor 91 discharges through resistors 83 and 81 and potentiometer 79. If the resistance of resistor 83 is substantially greater in value than the sum of resistances of resistor 81 and variable resistor 79, resistor 83 will control the discharging time constant of capacitor 91 and the discharging time constant will exceed the charging time constant. As explained below, the discharging of capacitor 83 controls the lowering of the cut-off frequency of active filtering means 9. When the system is used with signals in the audio frequency range, I prefer that the values of the circuit elements be selected so that the charging time constant is about 27 milliseconds and the discharging time constant is about 74 milliseconds to obtain the most rapid circuit response without sacrificing the fidelity of the input signal. As will be explained, these time constants are of sufficient length so that transients in the total input signal will not significantly affect the charge on capacitor 91.

At its output terminal, summer 89 produces the arithmetic sum of the signals appearing at its input terminals 87 and 101. Input terminal 101 receives a bias voltage, negative in polarity, from voltage source 93, resistor 97 and variable resistor 95. When no charge is being applied to input terminal 87, that is, when the desired signal contains little high frequency energy, the cut-off frequency of active filtering means 9 decreases to its lower limit. Since in the absence of a charge on capacitor 91 active filtering means 9 receives from output terminal 100 of summer 89 only the sum of the voltages that appear across resistor 97 and the portion of variable resistor 95 selected by moveable element 99, the adjustment of moveable element 99 of variable resistor 95 establishes the lower limit of the cut-off frequency range of active filtering means 9 at a desired frequency.

When the system is used in the audible frequency range, I prefer that the minimum lower cut-off frequency limit be established at about 3 kHz, which is higher than the upper limit of the fundamental frequency range of the human voice and the fundamental frequency of the highest notes on nearly all musical instruments (the exceptions including the piccolo and the highest notes of the violin), so as to avoid loss of fidelity. I prefer to choose the circuit element values of the comparison and control means circuit of FIG. 4 so that when moveable element 99 of variable resistor 95 is adjusted to apply the full potential of sorce 93 to terminal 101 of summer 89 and capacitor 91 is not charged, a cut-off frequency of about 3 kHz is attained. The value of resistor 97 is preferably chosen so that when the bias voltage applied to input terminal 101 is least negative and capacitor 91 is not charged, the maximum lower limit cut-off frequency is about 6 kHz. The charging of capacitor 91 raises the cut-off frequency of the system, the upper limit cut-off frequency being achieved when the maximum charge accumulates on capacitor 91. The maximum charge that may accumulate on capacitor 91 is determined by its capacitance and by the values of the circuit elements connected to it and, in particular, the setting of the moveable element of variable resistor 79. I prefer to select the circuit element values so that when the system is used in the audible frequency range and when the moveable element of variable resistor 79 is set so as to interpose no resistance between multivibrator 77 and resistor 81, the maximum charge which may accumulate on capacitor 91 produces a upper limit cut-off frequency of about 15 kHz.

Figure 5:
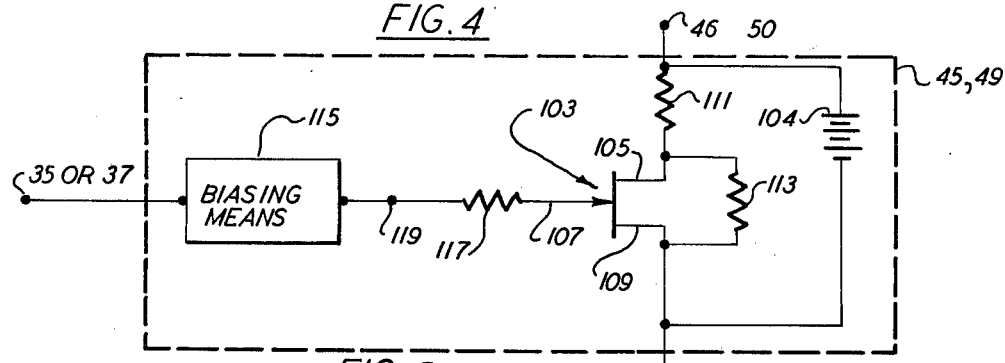
FIG. 5 shows a schematic diagram of an electronic circuit which may be used as part of the active filtering means shown in FIG. 3.

The output signals from comparison and control means 13 are impressed on the input terminals 35, 37 of active filtering means 9 to control its frequency response. This control is effected by the adjustment of variable resistance means 45 and 49. Referring to FIG. 5, a schematic diagram of the preferred circuitry for each of the variable resistance means 45, 49 of FIG. 3 is shown. This circuitry comprises: an n-channel field-effect transistor 103 with a drain 105, a gate 107 and a source 109; drain bias-resistor 111; resistor 113 connected from source 109 to drain 105; and a voltage source 104 connected from source 109 to resistor 111. The source-to-drain resistance, which is controlled by the negative bias voltage appearing at gage 107, acts as the variable resistance element. The total resistance of each variable resistance means 45, 49 is the sum of the resistance of resistor 111 and the parallel resistance of resistor 113 and the field-effect transistor resistance. Field-effect transistor 103 receives its gate bias voltage from a biasing means 115, which is connected to resistor 117 and thence to gate 107. The operation of biasing means 115 is explained hereinafter. As the gate bias voltage becomes more negative, the source-to-drain resistance of field-effect transistor 103 increases, lowering the cut-off frequency of active filtering means 9. Conversely, an increase in gate bias voltage decreases the source-to-drain resistance of field-effect transistor 103, causing the cut-off frequency to increase. To avoid undesirable effects on the audio signal, the gate bias voltage of field-effect transistor 103 must be applied so that it will not cause direct current to flow within active filtering means 9.

Figure 6:
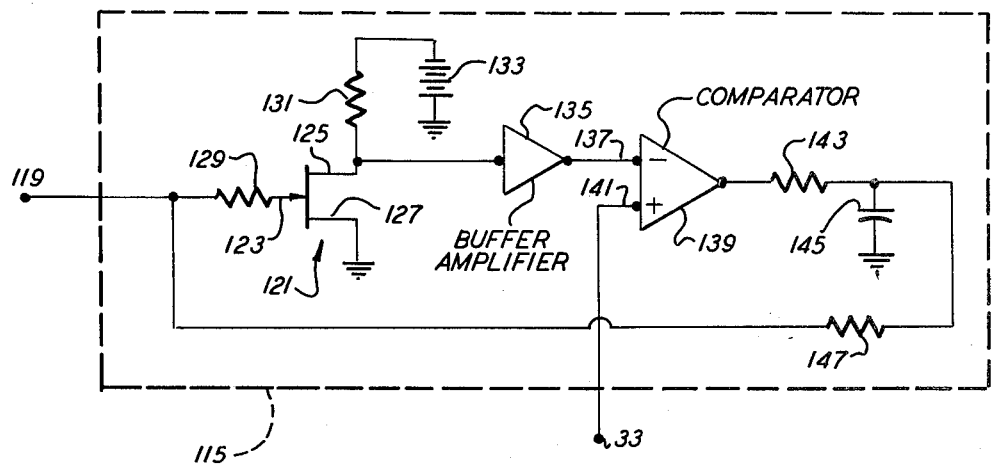
FIG. 6 shows a schematic diagram of an electronic circuit which may be used as part of the variable resistance means shown in FIG. 5; and, FIG. 7 is a schematic diagram of an electronic circuit which may be used as part of the embodiment of FIG. 1.

Control and comparison means 13 of FIG. 1 produces a control voltage by means of such circuitry as that shown in FIG. 4. Means 13 additionally adjusts the cut-off frequency of active filtering means 9, and the latter function is preferably accomplished by the circuit shown in FIG. 6. The circuit of FIG. 6 is a biasing means which establishes the value of the variable resistance means 45, 49 of active filtering means 9, the circuit of FIG. 3, by applying a bias voltage to field-effect transistor 103. The circuit has an input terminal 119 connected to gate bias resistor 117 of FIG. 5 and to an n-channel field-effect transistor 121 which includes a gate 123, a drain 125, and a source 127. A gate-coupling resistor 129 is interposed between terminal 119 and gate 123. A drain bias resistor 131 connected to a voltage source 133 is connected to drain 125. A buffer amplifier 135 is connected to the negative sense input terminal 137 of a comparator 139. The output of comparison and control means 13 in FIG. 1 is impressed on the positive sense input terminal 141 of comparator 139. The output terminal of comparator 139 is connected to resistor 143 to which is connected a grounded capacitor 145. A feedback resistor 147 is connected between the juncture of elements 143 and 145, and gate resistor 129.

Field-effect transistors 103 and 121 are advantageously a matched pair, preferably fabricated simultaneously on the same semiconductor substrate so as to have virtually identical electrical characteristics. The gates 107, 123 of transistors 103 and 121 are connected to each other through preferably identical value gate resistors 117 and 129 as shown in FIGS. 5 and 6, and the sources 109, 127 are connected through a common ground. Thus, the control of the source-to-drain resistance of one field-effect transistor will identically regulate the source-to-drain resistance of the other in the preferred circuitry. The charge on capacitor 145 provides that dual control. If the voltage from buffer amplifier 135 at input terminal 137 of comparator 139 has a greater negative magnitude than the negative control voltage appearing at input terminal 141, the output voltage of comparator 139 will be positive, causing capacitor 145 to charge and change the bias voltage on gate 123 of field-effect transistor 121 in a positive direction. As a result, the source-to-drain resistance of field-effect transistor 121 decreases, causing the voltage at drain 125 and at input terminal 137 of comparator 139 to become less negative. The output signal of comparator 139 then becomes negative, reducing the bias voltage at gate 123 of field-effect transistor 121, which in turn reduces the voltage applied to terminal 137 of comparator 139. That is, the circuit oscillates so that capacitor 145 tends to remain charged at a voltage determined by the output voltage of comparison and control means 13 that is applied at input terminal 141 of comparator 139. The voltage, $V_D$, in volts, at drain 125 can be calculated from the series connection of the source-to-drain resistance and resistor 131 across voltage source 133 as $V_D = (V_O R_y)/(R_z + R_y)$, where $V_O$ equals voltage of voltage source 133 in volts, $R_z$ equals the resistance in ohms of resistor 131, and $R_y$ equals the resistance in ohms of the source-to-drain resistance. The voltage at terminal 137 of comparator 139 then equals $(AV_O R_y)/(R_z + R_y)$ if the gain of buffer amplifier 135 equals A. If $R_z$ is chosen to be much larger than $R_y$, $V_D$ essentially equals $AV_O R_y/R_z$; that is, the source-to-drain resistance of field-effect transistor 121 (and therefore of field-effect transistor 103) is a linear function of the output voltage of comparison and control means 13.

The invention discussed above is effective in reducing continuous noise in a total input signal. Since the system is unresponsive to transients, transient noise is also reduced; however, because occasionally audio and noise transients may have similar frequency characteristics, audio transients may also be suppressed. Therefore, transient detector and discriminator means 11 can advantageously be incorporated in the system for detecting the presence of transient signals and for distinguishing noise transients from audio transients. Such a means for use with the circuit of FIG. 4 is described below.

Referring to FIG. 4, it will be recalled that the charging time constant of capacitor 91, is determined by that capacitor's electrical capacity and the resistance of resistor 81. That charging time constant is chosen so that noise transients will not significantly increase the charge on capacitor 91, which would increase the cut-off frequecncy and cause the retention of the noise transient in the processed signal. However, since audio transients sometimes have rise times similar to those of noise transients, transient detector and discriminator means 11 can be used to charge capacitor 91 rapidly in the presence of an audio transient for the purpose of raising the cut-off frequency and thereby retaining the audio transient in the processed signal.

Figure 7:
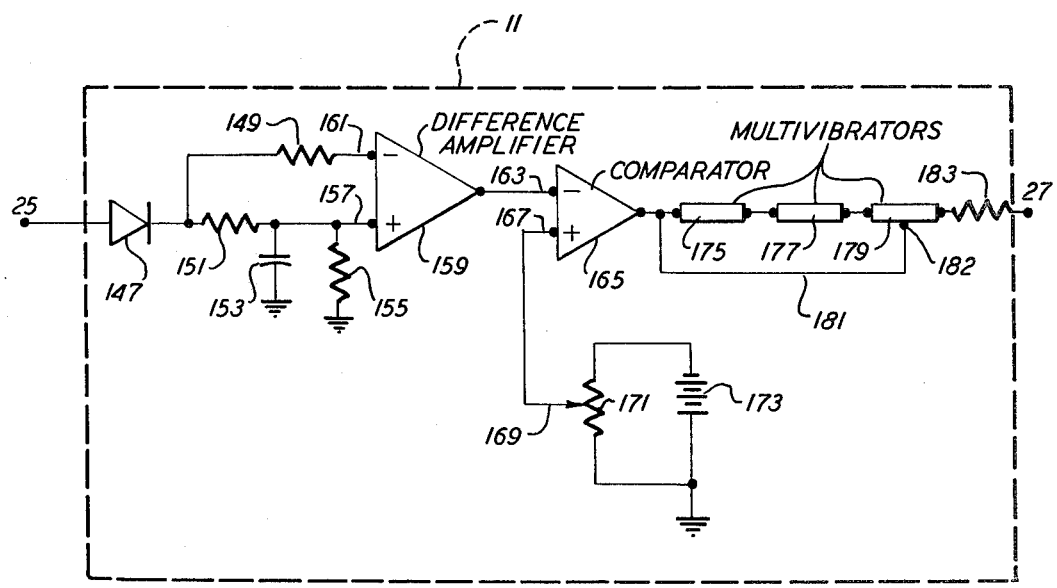

A preferred transient detector and discriminator means circuit is shown in FIG. 7. The circuit has an input terminal corresponding to terminal 25 in FIG. 1, which is connected to half wave rectifier 147. The rectifier is connected to resistors 149 and 151. The latter resistor is connected to a grounded capacitor 153 which is connected in parallel with a grounded resistor 155 to form a delay circuit, and to the positive sense input terminal 157 of a difference amplifier 159. Resistor 149 is connected from the junction of resistor 151 and rectifier 147 to the negative sense input terminal 161 of difference amplifier 159. The output terminal of difference amplifier 159 is connected to the negative sense input terminal 163 of a comparator 165. The positive sense input terminal 167 of comparator 165 is connected to the moveable element 169 of a variable resistor 171, across which is connected a voltage source 173. The output of comparator 165 is connected both to the input of series-connected multivibrators 175, 177 and 179, and via line 181 to an enabling terminal 182 of multivibrator 179. The output of multivibrator 179 is connected to one end of a resistor 183, the other end providing the circuit's output terminal which corresponds to terminal 27 in FIG. 1 and is connected to input terminal 29 of comparison and control means 13.

The transient detector and discriminator means circuit increases the cut-off frequency of the active filtering means upon the detection in the total input signal of a transient determined to be an audio transient. The operation of the circuit of FIG. 7 assumes that noise transients have a short maximum duration relative to the duration of the audio transients. When the circuit of FIG. 7 is used in conjunction with the circuit of FIG. 4, it causes the charge on capacitor 91 to rise rapidly to a maximum value only if the transient is of a duration longer than a minimum time which I prefer to be about nine milliseconds. By experiment, I have determined that a nine millisecond delay in the rise of an audio transient imposed by the circuitry of FIG. 7 does not result in a perceived loss of fidelity in the desired signal.

In the circuit of FIG. 7, the total input signal is half wave rectified by rectifier 147 and applied to terminal 161 of difference amplifier 159. Resistors 151 and 155 in the delay circuit slow the charging and discharging of capacitor 153 so that the voltage at terminal 157 of difference amplifier 159 slowly follows the positive envelope of the total input signal. Because of the effect of the delay circuit, a transient in the total input signal will cause the voltage impressed at terminal 161 to rise briefly over that at terminal 157. During that rise the output voltage of difference amplifier 157 is driven negative causing the output of comparator 165 to switch from a negative sense to a positive sense, if the signal at terminal 163 of comparator 165 is more negative than the bias voltage applied at terminal 167 by voltage source 173 and variable resistor 171. Variable resistor 171 permits selection of the minimum amplitude of the transient that may potentially cause capacitor 91 to charge rapidly (when the circuit is used with the circuit of FIG. 4). The output signal of comparator 165 is applied to multivibrator 175 and to enabling terminal 182 of multivibrator 179. As is known in the art, the delay between the arrival of an input pulse at a multivibrator and the emitting of a pulse at the multivibrator output, and the duration of the output pulse, may be selected by the design of the multivibrator. I prefer in this embodiment that multivibrator 175 insert a delay of two milliseconds and that its output pulse cause multivibrator 177 to emit a pulse of seven milliseconds duration. Only if there are simultaneously present pulses at both the input to multivibrator 179 and its enabling terminal 182, that is, only if a transient lasts for nine milliseconds or more, does multivibrator 179 emit a pulse through resistor 183. Multivibrator 179 is designed in conjunction with resistor 183 to charge capacitor 91 so that the system reaches its maximum cut-off frequency, preferably 15 khz, rapidly in comparison to the duration of the detected audio transient. By experiment, I have determined that typically a second noise transient does not follow a first one within nine milliseconds so that essentially no loss in the effectiveness of the circuit occurs while multivibrators 175 and 177 are returning to their quiescent states after being triggered by a noise transient (multivibrator 179 having not been triggered).

The invention according to the preceding embodiment thus effectively reduces noise in electrical audio signals in a manner which is free of disturbing audible side effects and does not impair the perceived fidelity of the sound, thereby accomplishing the objects set forth above. The circuitry of the preferred embodiment is both practicable and economical in use, not requiring a plurality of filters nor encoding and decoding of the input signal.

The invention has been described in detail with particular emphasis on the preferred embodiment, but it will be understood that variations and modifications within the spirit and scope of the invention may occur to those skilled in the art to which the invention pertains.

What is claimed is:

1. A system for suppressing noise in a total input signal in electrical form, comprising:
first means for producing a first signal proportional to the peak amplitude of the rate of change with respect to time of the total input signal;
second means for producing a second signal proportional to the instantaneous amplitude of the total input signal;
selection means for selecting an operating frequency band for use with the second means, the second means producing the second signal proportional to the instantaneous amplitude of the portion of the total input signal falling within the selected frequency band;
control and comparison means for comparing the first and second signals to obtain an indication of the noise in the total input signal relative to the amplitude and frequency characteristics of the total input signal, and for generating a control signal according to said indication; and
active filtering means having a cut-off frequency selected in response to said control signal, said active filtering means filtering from the total input signal components of the total input signal according to the selected cut-off frequency to suppress noise in the total input signal.

2. The system according to claim 1, wherein the first means comprises differentiating means shunted by capacitive and resistive means for producing a signal proportional to the peak amplitude of the time rate of change of the total input signal.

3. The system according to claim 1, wherein the selection means for selecting an operating frequency band comprises a bandpass filter.

4. The system according to claims 1 or 2, wherein the active filtering means comprises active low-pass filtering means.

5. The system according to claim 4, wherein the active low-pass filtering means comprises active high-pass filtering means having an output and difference means for subtracting the signal produced at the output of the high-pass filtering means from the total input signal applied to the high-pass filtering means, to produce a frequency response characteristic of an active low-pass filtering means.

6. The system according to claims 1 or 2, and further including:
detecting means for detecting the presence of one or more transient signals contained in the total input signal, and for generating transient detection signals in response to the detection of such presence;
transient discriminating means for evaluating said detection signals and for generating discrimination signals indicative, respectively, of the presence of noise transients and input signal transients; and,
adjustment means responsive to said discrimination signals for adjusting the cut-off frequency of the active filtering means in the presence of an input signal transient to retain the transient as part of the signal.

7. The system according to claim 6, wherein the detecting means comprises:
delay means for producing a third signal proportional to the peak envelope of the total input signal, but delayed in time with respect to the total input signal; and,
amplitude comparison means for comparing the amplitude of the third signal with the amplitude of the total input signal to determine whether the amplitude of the total input signal exceeds the amplitude of the third signal.

8. The system according to claim 7, wherein the delay means comprises resistance means and second capacitance means, said resistance means being connected in series and parallel with said capacitance means.

9. The system according to claim 6, wherein the transient discriminating means comprises timing means for discriminating between transients of durations shorter than or longer than a selected time period and for generating a signal indicative of the relative duration of a transient to actuate the adjustment means.

10. The system according to claim 9, wherein the timing means comprises a plurality of series-connected multivibrators, the final series multivibrator having both signal input and enabling input terminals, the transient detection signal being applied both to the first series multivibrator and to the enabling terminal of the final series multivibrator, the multivibrator series being triggered by a transient of a duration longer than the selected duration.

11. The system according to claims 1 or 2, and further including variable resistance means responsive to the control signal to select the cut-off frequency of the active filtering means.

12. The system according to claim 11, wherein the variable resistance means includes first field-effect transistor means, having voltage-biased gate, source and drain terminals, the variable resistance means comprising the drain-to-source resistance of the first field-effect transistor means, and biasing means for adjusting the bias voltage impressed upon the gate terminal of the first field-effect transistor means.

13. The system according to claim 14, wherein the biasing means comprises:

second field-effect transistor means having voltage-biased drain, source and gate terminals, the gate terminal of said second field-effect transistor means being resistively coupled to the gate terminal of said first field-effect transistor means;

second comparison means for comparing the magnitude of the drain bias voltage of the second field-effect transistor means to the magnitude of the control signal and generating a bias adjustment signal proportional to the difference; and, feedback means for applying the bias adjustment signal to the gate terminals of the first and second field-effect transistor means, whereby the cut-off frequency of the active filtering means is selected and the drain bias voltage of the second field-effect transistor is adjusted in response to the control signal.

14. The system according to claims 1 or 2, wherein the control and comparison means comprises:

rectifying means for half wave rectifying the first signal;

comparison and detecting means for comparing the amplitude of the rectified first signal to the amplitude of the second signal and detecting changes in the amplitude of the second signal from less than to more than the amplitude of the half wave rectified first signal and producing a change signal in response to detection of such change;

generating means responsive to said change signals for producing an electrical pulse each time a change signal is produced; and leaky storage means for accumulating and gradually releasing the electric charge transferred by the pulses whereby the control signal is produced and the cut-off frequency of the active filtering means is selected.

15. The system according to claim 14, wherein the leaky storage means comprises:

third capacitance means having two terminals, one terminal being grounded, one terminal being non-grounded; and second resistance means resistively connecting the non-grounded terminal of the third capacitance means to the generating means and to a ground terminal so as to establish different charging and discharging time constants for the third capacitance means.

* * * * *